United States Patent [19]
Kawashima

[11] Patent Number: 6,163,053
[45] Date of Patent: *Dec. 19, 2000

[54] SEMICONDUCTOR DEVICE HAVING OPPOSITE-POLARITY REGION UNDER CHANNEL

[75] Inventor: Ikue Kawashima, Kobe, Japan

[73] Assignee: Ricoh Company, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/964,558

[22] Filed: Nov. 5, 1997

[30] Foreign Application Priority Data

Nov. 6, 1996 [JP] Japan .................................. 8-293875

[51] Int. Cl.$^7$ .......................... H01L 29/76; H01L 29/167
[52] U.S. Cl. .......................... 257/335; 257/403; 257/607
[58] Field of Search ..................................... 257/401, 402, 257/345, 335, 336, 403, 376, 607; 254/404

[56] References Cited

U.S. PATENT DOCUMENTS

| | | | |
|---|---|---|---|
| 4,916,500 | 4/1990 | Yazawa et al. | 257/404 |
| 5,025,293 | 6/1991 | Seki | 257/345 |
| 5,489,795 | 2/1996 | Yoshimimura et al. | 257/369 |
| 5,548,143 | 8/1996 | Lee | 257/269 |
| 5,675,172 | 10/1997 | Miyamoto et al. | 257/402 |
| 5,712,501 | 1/1998 | Davies et al. | 257/335 |
| 5,719,422 | 2/1998 | Burr et al. | 257/336 |
| 5,986,314 | 11/1999 | Seshadri et al. | 257/402 |

FOREIGN PATENT DOCUMENTS

5-21730  1/1993  Japan .

Primary Examiner—Olik Chaudhuri
Assistant Examiner—William David Coleman
Attorney, Agent, or Firm—Cooper & Dunham LLP

[57] ABSTRACT

A semiconductor device and fabrication method thereof are provided, which include an opposite-polarity region formed in a predetermined location under a gate channel region, having a conductive property opposite to that of a surrounding well region. The gate voltage is controlled so that a second depleted layer region is induced concurrently with the opposite-polarity region by the applied gate voltage and can be coupled with a first depleted region which is formed under the channel region and is controllable by the applied gate voltage. In this structure of the semiconductor device, drain current of the device is rendered more responsive to the applied gate voltage, and leakage currents at a certain applied drain voltage and at zero gate voltage are reduced, thereby reducing the standby currents of the semiconductor device.

5 Claims, 12 Drawing Sheets

SEMICONDUCTOR DEVICE HAVING OPPOSITE-POLARITY REGION UNDER CHANNEL

BACKGROUND OF THE INVENTION

1. Field of the Invention

This invention relates to a semiconductor device having a transistor of MOS structure and an opposite-polarity region under a channel region of the transistor, and a method of fabricating the same semiconductor device.

2. Description of the Related Art

As integration of semiconductor devices advances toward higher density, miniaturization of the devices continues. Although metal-oxide-semiconductor field effect transistors (MOS FET) are advantageous for integration, the power consumption of the semiconductor devices increases with the increasing degree of integration.

Accordingly, semiconductor devices having MOS structure are suitable when higher integration and low power consumption are both required. In addition, the demands of gate oxide reliability requires that the supply voltage be reduced for the semiconductor devices.

To implement the low supply voltage for semiconductor devices, it is necessary for a transistor to have a low threshold voltage $V_{th}$ to switch from on-state to off-state, or vice versa. In conventional semiconductor devices, however, there has arisen a problem in that some amount of leakage currents persist between the drain and source even at zero gate voltage.

In an attempt to obviate the above problem, there have been disclosed two transistor structures, in which, generally, a shallow well region is formed on a semiconductor substrate and just under a gate electrode, and by decreasing the depth of the shallow well region, a reverse bias capacitance between the semiconductor substrate and the well region is coupled with a depletion layer capacitance under the channel region, thereby achieving activation of the transistor at a substantially lower voltage.

Figure 12:
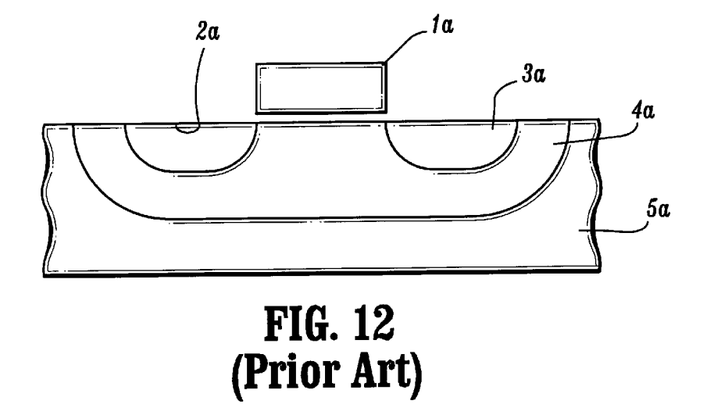
FIG. 12 is a cross-sectional view of a prior art semiconductor device having a shallow well region.

These two structures will be described hereinbelow. One of the semiconductor structures has been disclosed in Japanese Laid-Open Patent Application No. 5-21730. According to the disclosure, as shown in FIG. 12 of the present application, a shallow well region 4A is formed on a surface region 5A of a semiconductor substrate and just under a gate electrode 1A, having a depth of 1.5 micron at most from the surface of the semiconductor substrate, and a MOS transistor is formed in a diffusion region 4A. By decreasing the depth of the region 4A, a reverse bias capacitance between a semiconductor substrate 5A and a well region 4A is coupled with a depletion layer capacitance under the channel region, which is controllable by a gate voltage applied to a gate electrode 1A. By this structure, a higher current between a source 3A and drain 2A has been obtained.

Figure 13:
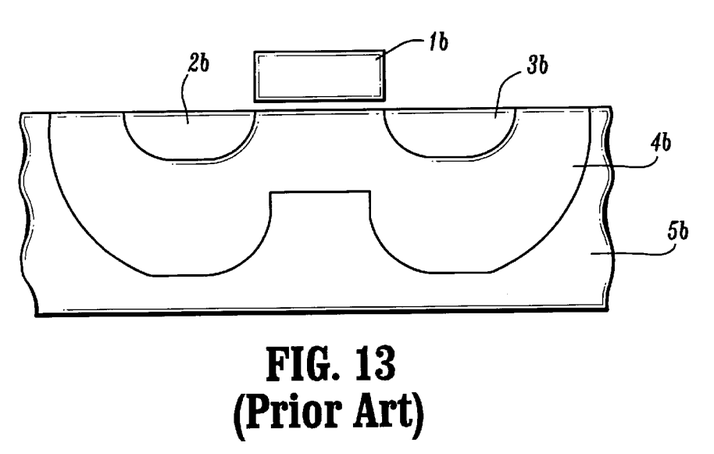
FIG. 13 is a cross-sectional view of another prior art semiconductor device having a shallow well region.

The other semiconductor structure has been disclosed in U.S. Pat. No. 5,489,795. According to the disclosure, as shown in FIG. 13 of the present application, a shallow well region 4B is formed on a surface region 5B of a semiconductor substrate and just under a gate electrode 1B, and a MOS transistor is formed in the diffusion region 4B, including a drain 2B, a source 3B, and the gate 1B.

In this structure, the depth of the shallow well from the surface of the substrate just under the gate electrode 1B is fabricated to be smaller than that under the drain 2B or source 3B, and a reverse bias capacitance between a semiconductor substrate 5B and a well region 4B is coupled with a depletion layer capacitance under the channel region. By this structure, activation of the transistor occurs at a substantially lower voltage, and thereby the drain current is more responsive to the applied gate bias voltage.

In the semiconductor devices with either one of the above-mentioned conventional structures, however, there has remained a problem that, because of a short distance between drain and substrate, some amount of leakage currents still persist between drain and substrate when a voltage is applied to the drain even at zero gate voltage, thereby resulting in the increase of standby currents of the devices.

SUMMARY OF THE INVENTION

In one embodiment of the present invention, a semiconductor device includes an opposite-polarity region formed under a channel region, which has a polarity opposite to that of a surrounding well region The opposite-polarity region is formed in a predetermined location of a channel region in the semiconductor substrate such that, by applying a gate voltage, as above-mentioned, a second depleted region is induced concurrent with the opposite-polarity region and can be coupled with a first depleted region which is formed under the channel region and is controllable by the applied gate voltage.

In another embodiment, the present invention provides a method of fabricating a semiconductor device, including the steps of forming a MOS field effect transistor in a well region; and forming an opposite-polarity region in a predetermined location under a gate channel region of the MOS field effect transistor, thereby forming a semiconductor device.

The above-mentioned opposite-polarity region may preferable be formed to have a distance of 0.5 micron at most between the uppermost portion of the opposite-polarity region and the lowermost portion of the gate electrode.

In still another embodiment, the present invention provides a method of fabricating a semiconductor device, including the steps of:

forming a gate oxide layer on the semiconductor substrate having a predetermined concentration of impurities of a first conductive type;

forming under the gate oxide layer on the surface of the semiconductor substrate a channel region of a second conductive type by implanting ions which are of the second conductive type and have a predetermined energy and dose;

forming a polysilicon layer of the first conductive type to a predetermined thickness and thereafter subjecting the polysilicon layer to a patterning process using a conventional photolithography technique to form the gate electrode;

forming source and drain regions of low impurity concentration of the fist conductive type by implanting ions which are of the first conductive type and have a predetermined energy and dose;

forming both a well region and the opposite-polarity region by the oblique implantation of ions which are of the second conductive type and have a predetermined energy and dose into the substrate with an incidence angle of 45°;

forming a silicon oxide layer by high temperature CVD to a predetermined layer thickness, and subsequently subjecting the silicon oxide layer to an etch back process to form a pair of side walls on opposing walls of the gate electrode; and forming high impurity concentration portions in the source and drain regions by implanting ions which are of the first conductive type and have a predetermined energy and dose using the pair of side walls and the gate electrode as a mask.

In another embodiment, the present invention provides a method of fabricating a semiconductor device including the step of implanting ions which are of a predetermined conductive type, energy and dose incident normal into the semiconductor substrate using the pair of side walls and the gate electrode as a mask, to form (1) a high impurity concentration portion in the source and drain regions, and (2) an opposite-polarity region as a residue of the semiconductor substrate of the first conductive type, in place of the above-mentioned step of forming both a well region and the opposite-polarity region by the aforementioned oblique implantation of ions with an incidence angle of 45°.

In another embodiment, the present invention provides a method of fabricating a semiconductor device, further including the steps of forming an n well region and a p well region on a silicon semiconductor substrate having a specific impurity concentration prior to the formation of the MOS field transistor and the opposite polarity region.

In the structure of the semiconductor device fabricated in the present invention, an opposite-polarity region is formed in a predetermined location under a gate channel region of the MOS field effect transistor, and of a conductive type opposite to that of the well region. The semiconductor device is operated, by applying a gate voltage in such a manner that a second depleted region is induced concurrent with, and surrounding the opposite-polarity region and can be coupled with a first depleted region formed under the gate channel region.

By this structure of the semiconductor device, drain currents of the semiconductor are rendered more responsive to the applied gate voltage. Also, standby currents can be reduced, since the distance between a drain and substrate is fabricated to have an arbitrary length appropriate for reducing leakage currents at a certain applied drain voltage and at zero gate voltage.

BRIEF DESCRIPTION OF THE DRAWINGS

Preferred embodiments of the invention are described hereinbelow with reference to the drawings wherein.

DESCRIPTION OF THE ILLUSTRATIVE EMBODIMENTS

Figure 2A:
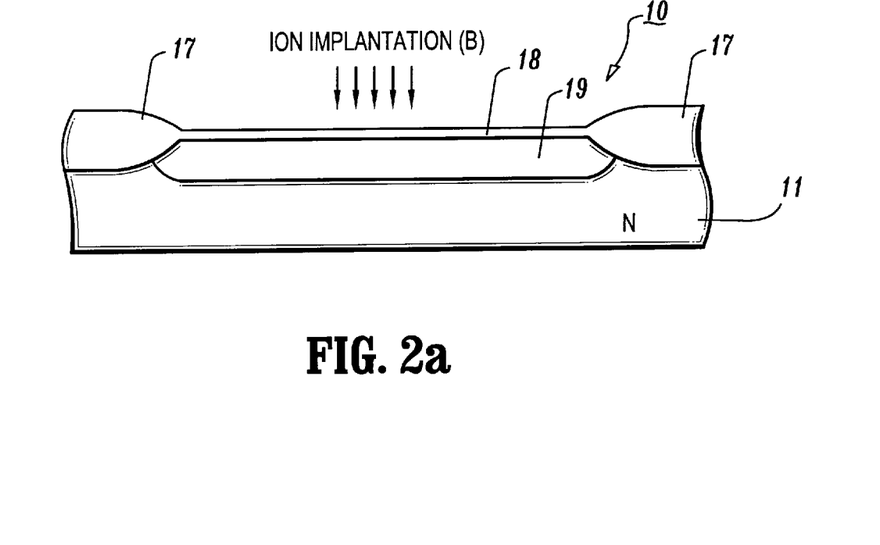
FIGS. 2a through 2d are cross-sectional views of a semiconductor device in accordance with a first embodiment of the present invention during initial steps in the fabrication process.
Figure 2B:
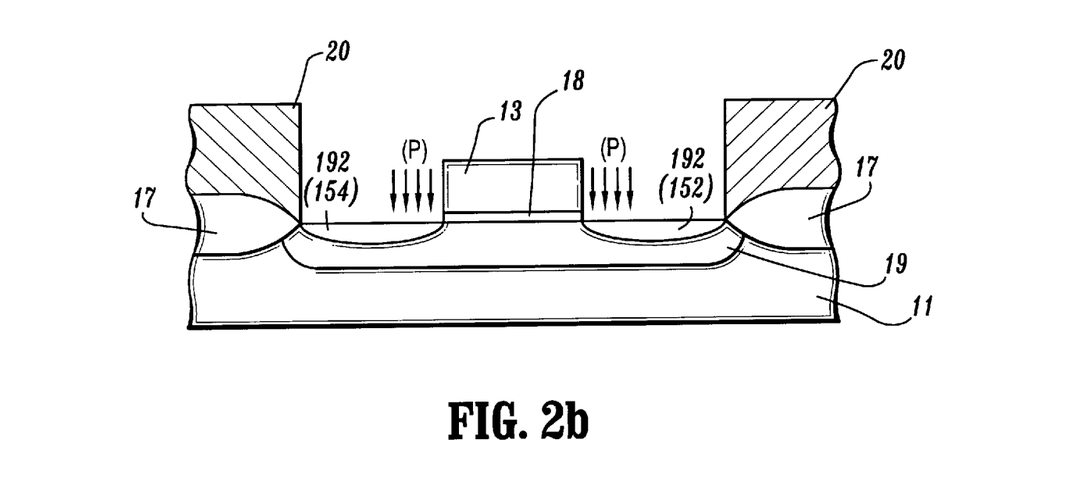
Figure 2C:
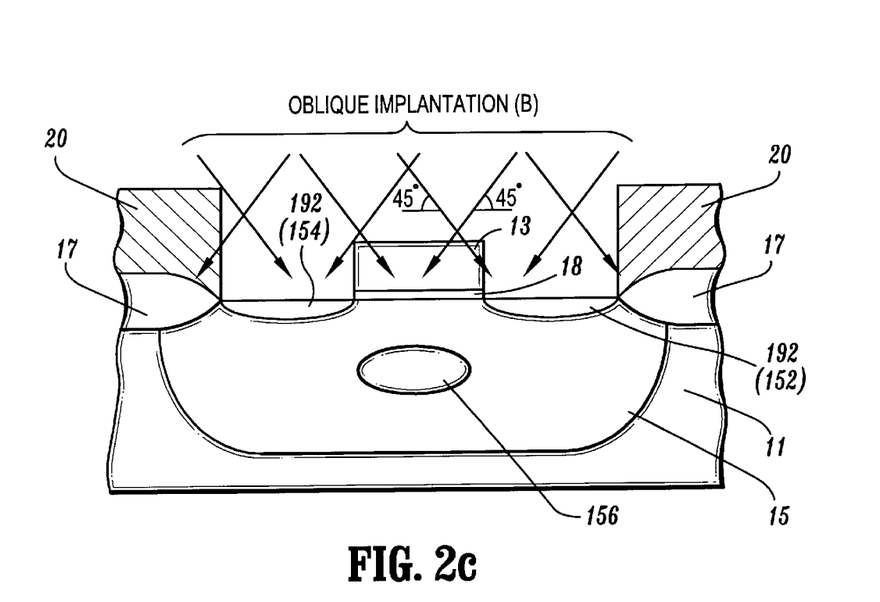
Figure 2D:
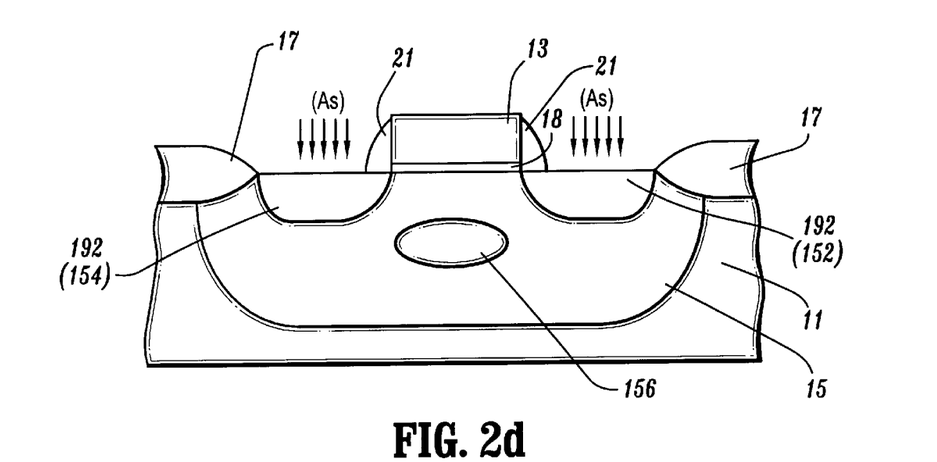

A description is given of the first embodiment of the present invention with reference to FIGS. 2a through 2d, which show cross-sections of a semiconductor device of the preferred embodiment of the present invention observed at different manufacturing steps. As will be described hereinbelow, the manufacturing process of the first embodiment is characterized by a step of forming an opposite-polarity region 156 which is surrounded by a well region 15 and situated under a channel region, by implantation after formation of a gate electrode 13, as shown in FIG. 2d.

Referring to FIG. 2a, a field oxide layer 17 for isolation of silicon oxide is formed on a main surface of an n-type silicon semiconductor substrate 11, by a selective thermal oxidation process in which an oxidation resistant mask film (not shown) is used. The silicon semiconductor substrate 11 has a predetermined concentration of n-type impurities. Next, the mask film is removed in its entirety. By using the ion implantation process, p-type ions of a predetermined energy and dose are implanted into the silicon substrate 11 through the entire surface thereof, thereby forming a p-channel region 19 as shown in FIG. 2a. A surface portion of the silicon substrate 11 which is exposed by the removal of the mask film is then subjected to thermal oxidation. Thereby, a gate insulation film 18 of silicon oxide is formed.

Referring to FIG. 2b, an n-type polysilicon layer is formed by chemical vapor deposition. Then, a mask film is deposited by a resist process of a conventional photolithography technique, and the polysilicon film is subjected to a patterning process, thereby forming a gate electrode 13.

Thereafter, by using both a photoresist film 20 formed on the field oxide area and the gate electrode 13 as a mask, n-type ions of a predetermined energy and dose are implanted, and thereby a source region 152 and a drain region 154 are formed, both of which are n⁻ regions with a low n-type ion concentration.

Subsequently, as shown in FIG. 2c, both a well region 15 and an opposite-polarity (i.e., n-type) region 156 are formed by oblique implantation of p-type ions of a predetermined energy and dose into the substrate with an incidence angle of 45°.

A silicon oxide layer is then formed by high temperature CVD to a predetermined layer thickness, and etched back by, for example, a dry etching method, to form a pair of side walls 21 on opposing walls of the gate electrode 13, as shown FIG. 2d. Using the side walls 21 and gate electrodes 13 as a mask, $n^+$ portions in the source 152 and the drain 154 region, both of which have a high n-type ion concentration are formed by implanting n-type ions of a predetermined energy and dose.

To be more specific, the conditions under which the above-mentioned processes are carried out are as follows.

The concentration of n-type impurities of the silicon substrate 11 is approximately $1.6 \times 10^6 \text{cm}^{-3}$. The p-channel region 19 is formed by implanting p-type ions of an energy of approximately 10 keV and a dose of approximately $4 \times 10^{12} \text{cm}^{-2}$, and subsequently the gate insulation layer 18 is formed to a thickness of approximately 8 nanometers by thermal oxidation (FIG. 2a) Thereafter, the gate electrode 13 of n-type polysilicon is formed to a thickness of approximately 200 nanometers (FIG. 2b). Subsequently, an $n^-$ region which has a low n-type ion concentration and in which a source region 152 and a drain region 154 are to be formed, is formed by implanting n-type phosphorus ions of an energy of approximately 10 keV and a dose of approximately $2 \times 10^{13} \text{cm}^{-2}$. The well region 15 and the opposite-polarity region 156 are formed by implanting p-type boron ions of an energy of approximately 50 keV and a dose of approximately $1 \times 10^{13} \text{cm}^{-2}$ with a incidence angle of 45−, as aforementioned (FIG. 2c).

In addition, the thickness of the silicon oxide layer formed for the side walls 21 by high temperature CVD is approximately 200 nanometers, and implantation of n-type ions for the formation of the $n^+$ portions in the source and drain regions 152 and 154, which have a high n-type ion concentration, is carried out with n-type arsenic ions of an energy of approximately 15 keV and a dose of approximately $6 \times 10^5 \text{cm}^{-2}$.

The above-mentioned processes utilize methods such as oblique ion implantation, for example, thereby facilitating the manufacturing of semiconductor devices with a high yield and reproducibility, and which is able to retain the distance between the substrate and the drain region at an arbitrary length sufficient to achieve the presently desired transistor characteristics without further increasing the number of photolithography processes and/or the number of photoresist masks.

Figure 3A:
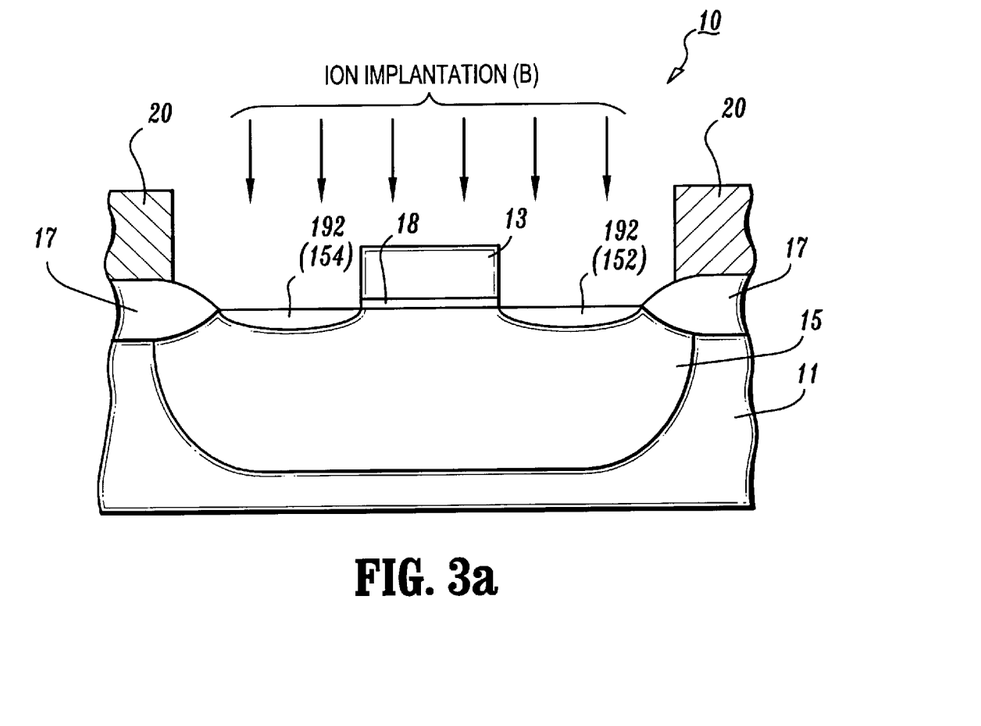
FIGS. 3a and 3b are cross-sectional views of a semiconductor device in accordance with a second embodiment of the present invention during the fabrication process.
Figure 3B:
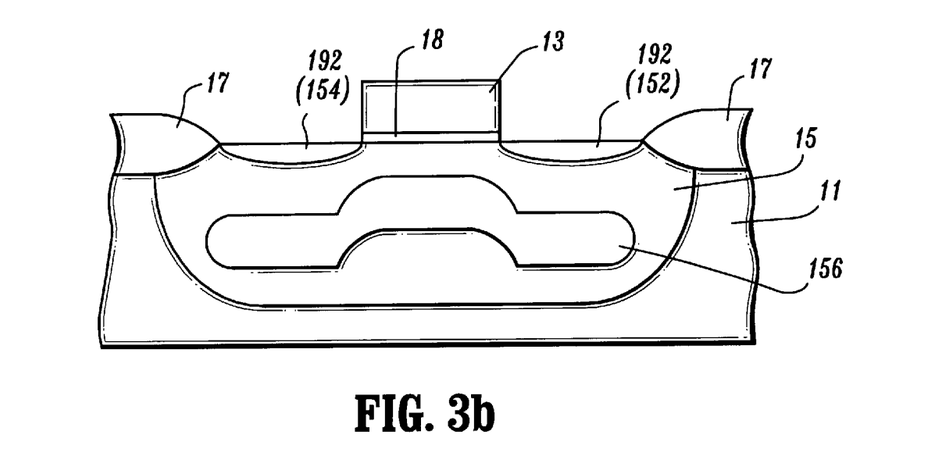

Referring to FIGS. 3a and 3b, a second embodiment of the present invention is described. In the following description, steps different from those previously described are primarily detailed.

As will be described hereinbelow, the manufacturing of the second embodiment is characterized by a step of implanting ions of a conductive type opposite to that of a well region 15 (i.e., n-type) incident normal through a gate electrode 13 previously disposed, thereby forming an opposite-polarity region 156 which is surrounded by a well region 15 and situated under the channel, source, and drain regions, as shown in FIG. 2b. In addition, the opposite-polarity region 156 can induce a second depleted region 14 as aforementioned, thereby making the drain current more responsive to the applied gate bias voltage.

Referring to FIG. 3a, in the process for the second embodiment, (1) prior to the formation of a gate electrode 13, a well region 15 is formed, (2) an $n^-$ source region 152 and an $n^-$ drain region 154 are subsequently formed, both of which have a low n-type ion concentration, and (3) an opposite-polarity region 156 is then formed by implanting ions which have a polarity (i.e., n-type) different from that of the well region 15 and which have a predetermined energy and dose, as shown FIG. 3b.

The above-mentioned processes have advantages such as being capable of manufacturing semiconductor devices with a high yield and reproducibility without increasing the number of photolithography processes and/or the number of resist masks, thereby preventing further complication in the manufacturing processes.

Figure 4A:
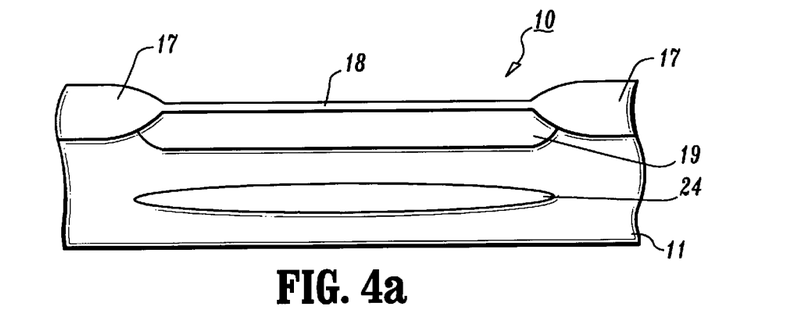
FIGS. 4a through 4c are cross-sectional views of a semiconductor device in accordance with a third embodiment of the present invention during the fabrication process.
Figure 4B:
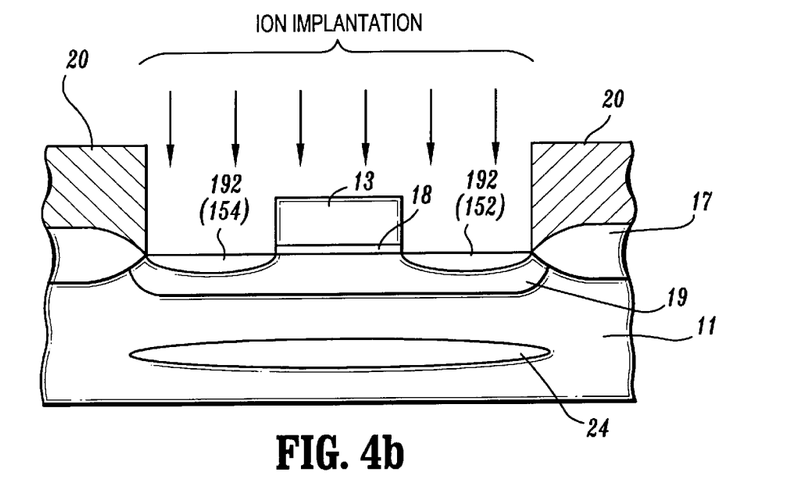
Figure 4C:
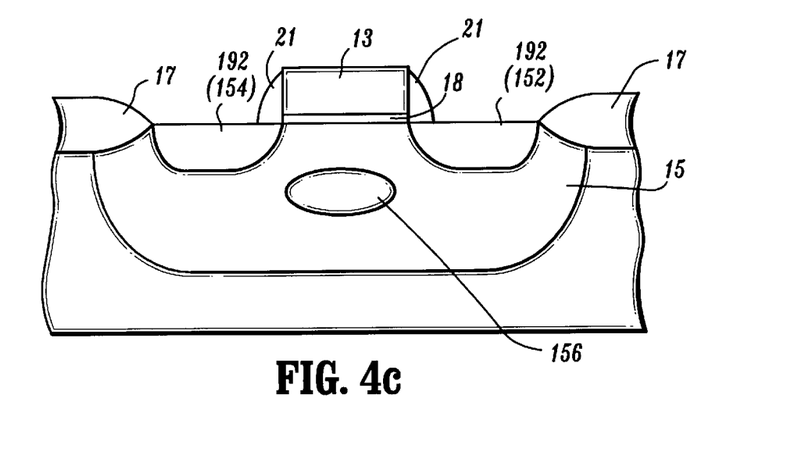

Referring to FIGS. 4a through 4c, a third embodiment of the present invention is described. In the following description, steps different from those previously described are primarily detailed with the same reference numerals representing the same or like elements.

The manufacturing of the third embodiment is characterized by the steps of (1) prior to the formation of a gate electrode 13, forming a second well region 24 which is situated deep under a channel region 19, and (2) subsequent to the formation of the gate electrode 13 and a first well region under the channel region 19, forming a well region 15 and an opposite-polarity region 156 which has a conductive type opposite to that of the well region 15 and surrounded by a well region 15, as shown FIG. 4c.

By utilizing the above-mentioned process of forming the second well 24 and the (first) well 15, an opposite-polarity region 156 and a concurrent second depleted region 14 (FIG. 1) are formed adjacent to the channel region and between the second well 24 and the first well, thereby implementing a structure of the present invention, which enables the drain current to be more responsive to applied gate bias voltage.

Referring to FIG. 4a illustrating the process for the third embodiment, prior to the formation of a gate electrode 13, a second well region 24 is formed, which is situated deep under a field region 17, by implanting n-type ions of a predetermined energy and dose. Subsequently, a gate electrode 13 is formed. After the formation of a gate electrode 13, a source region 152 and a drain region 154 are formed having a low ion concentration by another implantation with ions of a predetermined energy and dose. Thereafter, a pair of side walls 21 on opposing walls of the gate electrode 13 are formed. Using the side walls 21 and gate electrode. 13 as a mask, another implantation is carried out with the same n-type ions as mentioned above, of a predetermined energy and dose, so that (1) a high impunity concentration portion in the source and drain regions, and (2) the opposite-polarity region as a residue of the semiconductor substrate of the first conductive type, are both formed.

The above-mentioned process has advantages such as being capable of further providing the above-mentioned second depleted region 14 without increasing the number of photolithography processes and/or the number of resist masks, and thereby preventing further complication in the manufacturing processes.

MOS transistor characteristic measurements were obtained for a device according to the first embodiment of the present invention and for comparative first and second prior art devices. The measurements were carried out by (1) applying 1.5 volts to drain, (2) adjusting the potential of the gate and the substrate at 0 volts, and (3) measuring both values of the substrate and drain currents with increasing voltages applied to the gate. From the gate voltage and current values obtained, a sub-threshold coefficient or S-factor (mV/decade) is calculated. The S-factor represents a gate bias voltage value needed to increase source-drain current by one order of magnitude.

The smaller the substrate current, the more preferable the device characteristics. In addition, the smaller the S-factor, the more steep the increase of the drain current with the increase of gate voltage. For the MOS field effect transistor 10 of the first embodiment, a substrate current and an S-factor were obtained as 1 pA at most and 75, respectively. In contrast, in comparative first prior art devices, the substrate current was 4 μA at most and had an S-factor of 75, and for a comparative second prior art device, the substrate current was 1 pA and the S-factor was 85.

Accordingly, for the MOS field effect transistor 10 of the first embodiment, preferable values have been obtained for both the substrate current and the S-factor over prior art devices. In other words, both a minimal standby current and a sharp rise in the drain current with the gate voltage can be achieved simultaneously by the device 10 of the present invention.

Referring to FIGS. 5 through 8c, a fourth embodiment of the present invention is described. In the following description, fabrication steps different from those previously described are primarily detailed with the same reference numerals representing like or similar elements.

Figure 1:
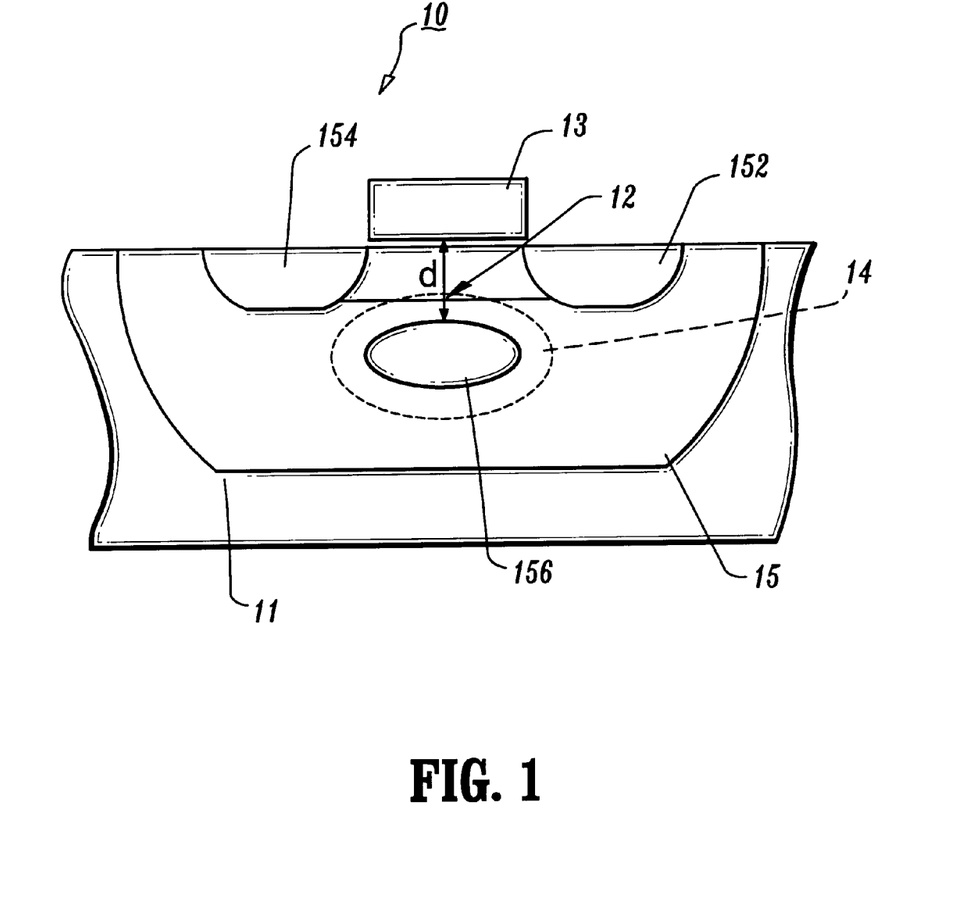
FIG. 1 is a cross-sectional view illustrating a semiconductor device according to an embodiment of the present invention.
Figure 5:
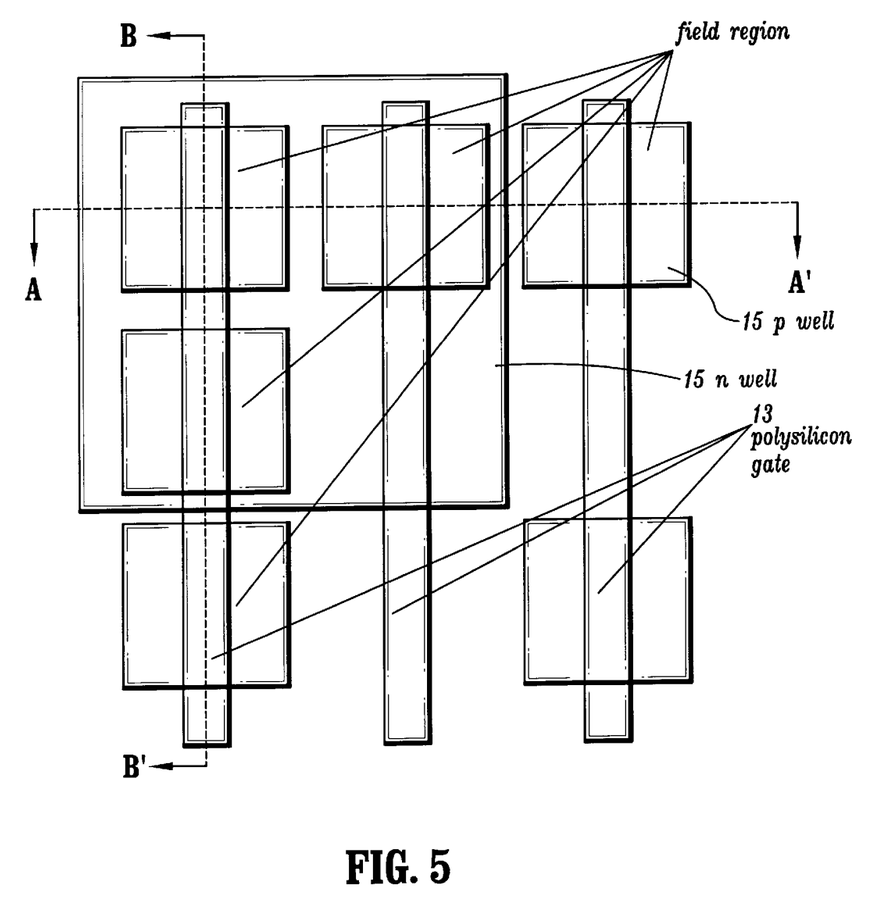
FIG. 5 is a top view of an integrated structure with the semiconductor devices of FIG. 1.

FIG. 5 is a plan view of MOS field effect transistors of the present invention including the device of FIG. 1. FIG. 7c and FIGS. 8a through 8c are cross-sectional views taken along the line A–A' of FIG. 5, and FIG. 7b is a cross-sectional view taken along the line B–B' of FIG. 5.

In addition, FIGS. 6a through 6c, FIGS. 7a through 7c, and FIGS. 8a through 8c, respectively, are views illustrating initial, middle and final steps during the fabrication process of the MOS field effect transistor according to an embodiment of the present invention.

Figure 6A:
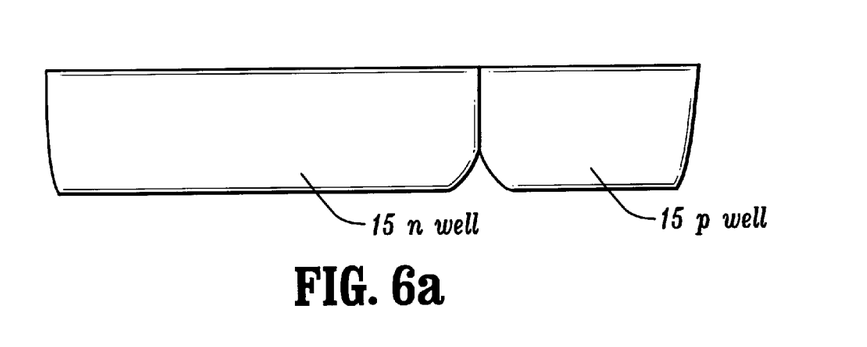
FIGS. 6a through 6c are cross-sectional views of the structure of FIG. 5 during initial steps in the fabrication process in accordance with a fourth embodiment of the present invention.
Figure 6B:
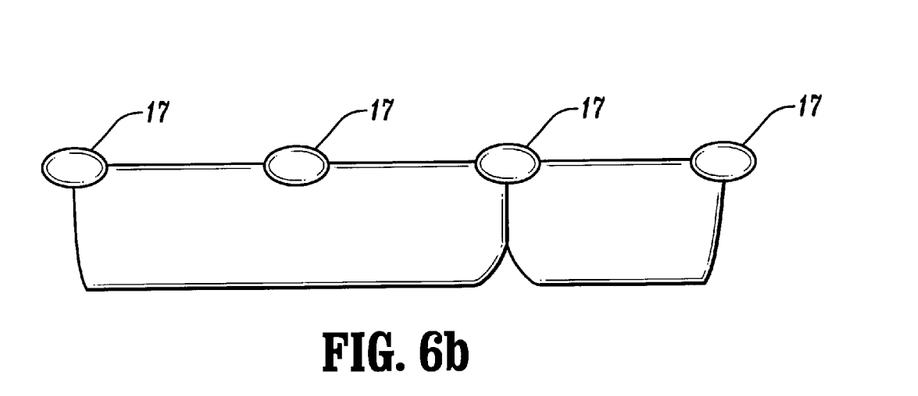

As shown in FIG. 6a, an n well region 15 and a p well region 15 are formed on a silicon semiconductor substrate with a specific impurity concentration of $1.7 \times 10^{14} cm^{-2}$. The n well region 15 is formed by implanting phosphorus ions of an energy of approximately 160 keV and a dose of approximately $2 \times 10^{13} cm^{-2}$ and then diffusing the ions thermally for 80 minutes at 1000° C. The p well region 15 is subsequently formed by implanting boron ions of an energy of approximately 30 keV and a dose of approximately $2 \times 10^{13} cm^{-2}$ and subsequently diffusing the ions thermally for 120 minutes at 1200° C. Thereafter, as shown in FIG. 6b, a field oxide 17 is formed by thermal oxidation to a thickness of 400 nanometers.

Figure 6C:
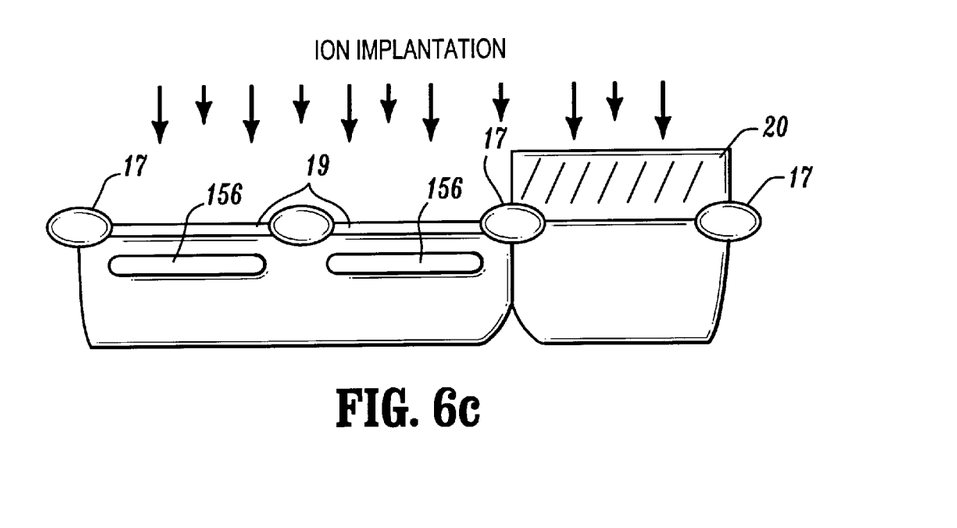

Referring to FIG. 6c, in the n well region 15, opposite-polarity (i.e., p-type) regions 156 are formed by implanting boron ions of an energy of approximately 30 keV and a dose of approximately $4 \times 10^{12} cm^{-2}$, and another implantation is subsequently carried out to form channel regions of p-channel MOS field effect transistor with phosphorus ions of an energy of approximately 30 keV and a dose of approximately $2.8 \times 10^{12} cm^{-2}$.

Figure 7A:
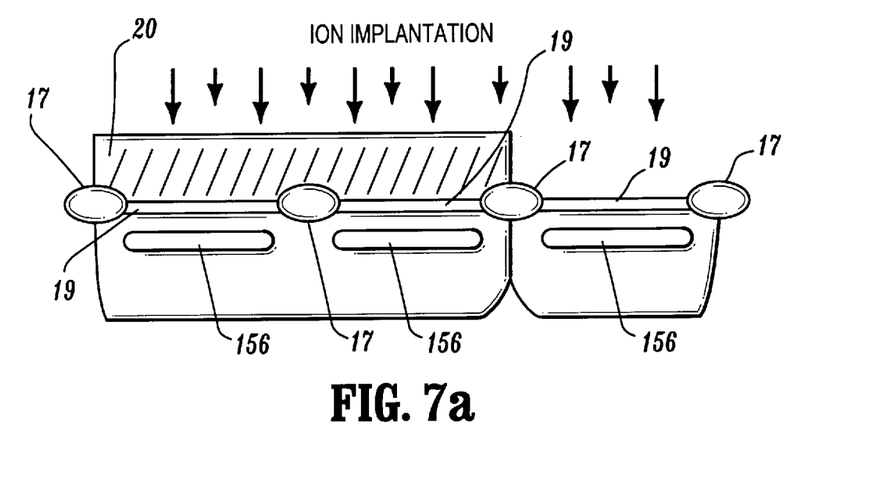
FIGS. 7a through 7c are cross-sectional views of the structure of FIG. 5 during middle steps in the fabrication process in accordance with the fourth embodiment of the present invention.
Figure 7B:
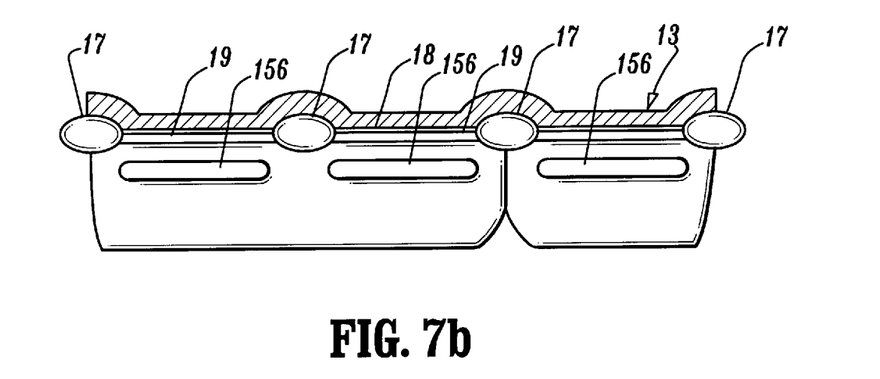

Referring to FIG. 7a, in the p well region 15, opposite-polarity regions 156 are formed by implanting phosphorus ions of an energy of approximately 100 keV and a dose of approximately $1 \times 10^{13} cm^{-2}$, and another implantation is subsequently carried out to form channel regions of n-channel MOS field effect transistor with boron ions of an energy of approximately 10 keV and a dose of approximately $9 \times 10^{12} cm^{-2}$.

Subsequently, a gate oxide layer 18 of silicon oxide is disposed by thermal oxidation to a thickness of 8 nanometers, and a non-doped polysilicon layer 13 is formed to a thickness of 200 nanometers, as shown in FIG. 7b.

Figure 7C:
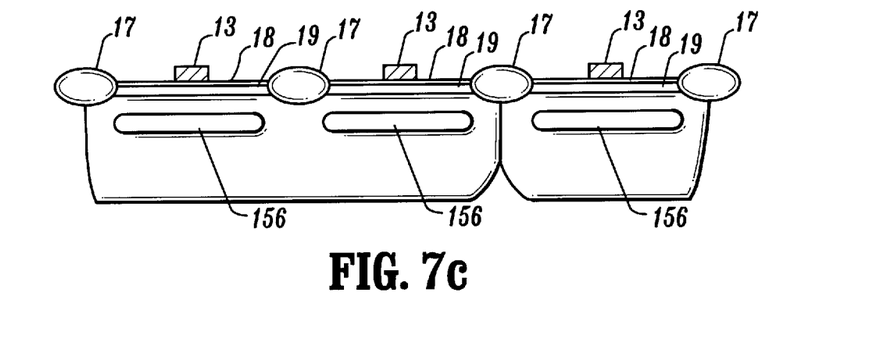

To form gate electrodes, implantation into gate forming regions for n-channel MOS transistors of the non-doped polysilicon layer 13 is carried out with arsenic ions of an energy of approximately 50 keV and a dose of approximately $5 \times 10^{15} cm^{-2}$ (FIG. 7c). Also, implantation into gate forming regions of p-channel MOS transistors of the non-doped polysilicon layer 13 is carried out with boron ions of an energy of approximately 10 keV and a dose of approximately $5 \times 10^{15} cm^{-2}$. Thereafter, a photo-etching process is carried out to define the pattern of the gate electrodes, thereby forming the gate electrode of the p-channel and n-channel devices.

Figure 8A:
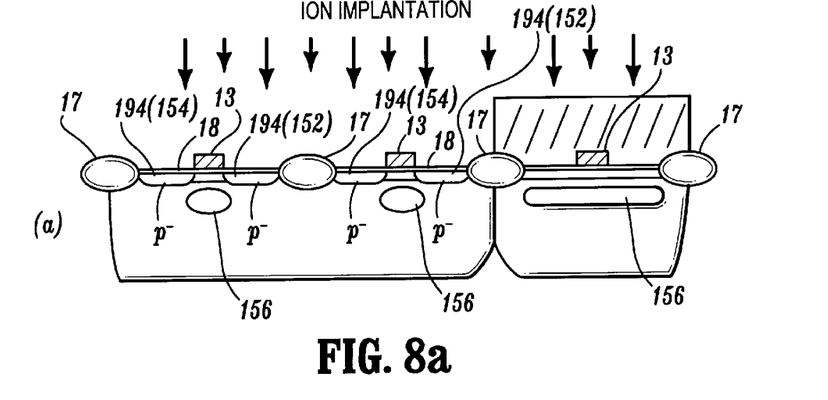
FIGS. 8a through 8c are cross-sectional views of the structure of FIG. 5 during final steps in the fabrication process in accordance with the fourth embodiment of the present invention.

To form p⁻ regions 194 in which source 152 and drain 154 regions of the p-channel MOS transistor are to be formed as shown in FIG. 8a, boron ions of an energy of approximately 10 keV and a dose of approximately $2 \times 10^{13} cm^{-2}$ are implanted. Subsequently, to form a shallow n well region, arsenic ions of an energy of approximately 150 keV and a dose of approximately $2 \times 10^{13} cm^{-2}$ are implanted.

Figure 8B:
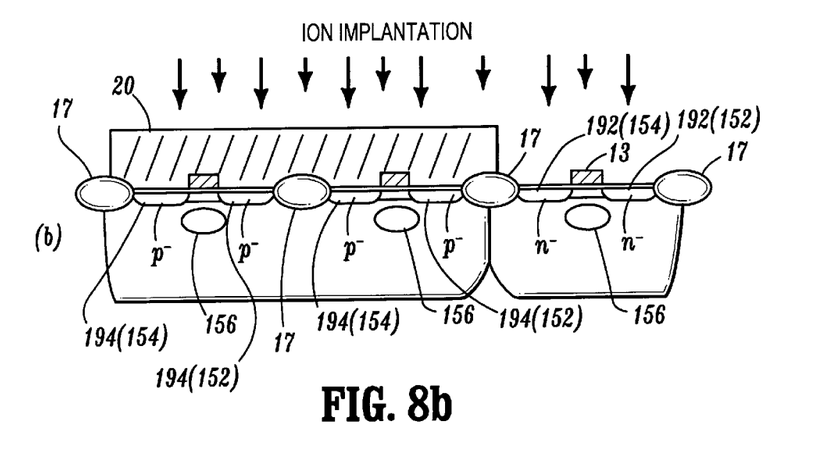

Furthermore, as shown in FIG. 8b, to form n⁻ regions 192 in which source 152 and drain 154 regions of the n-channel MOS transistor are to be formed, arsenic ions of an energy of approximately 10 keV and a dose of approximately $2 \times 10^{13} cm^{-2}$ are implanted. Subsequently, to form a shallow p well region, boron ions of an energy of approximately 40 keV and a dose of approximately $1 \times 10^{13} cm^{-2}$ are implanted.

Figure 8C:
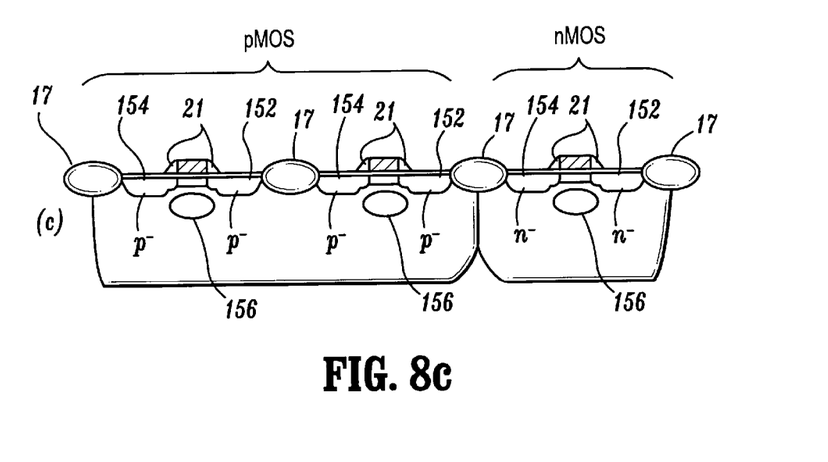

A silicon oxide layer is subsequently disposed by high temperature CVD to a thickness of 200 nanometers, and etched back by, for example, a dry etching method, to form a pair of side walls 21 on opposing walls of the gate electrode 13 of the MOS transistor, as shown FIG. 8c.

Thereafter, using the side walls 21 and gate electrodes 13 as a mask, portions at which high impurity concentration source 152 and drain 154 regions are to be formed, are implanted with (1) $BF_2$ ions of approximately 30 keV and a dose of approximately $5 \times 10^{15} cm^{-2}$ for p-channel MOS transistors, and (2) arsenic ions of approximately 30 keV and a dose of approximately $5 \times 10^{15} cm^{-2}$ for n-channel MOS transistors.

To obtain the MOS transistor characteristics, the devices fabricated as above are subjected to characteristic measurements. The measurements are carried out by (1) applying 1.5 volt to the drain, (2) adjusting the potential of the gate and the substrate at 0 volt, and (3) measuring both values of the substrate and drain currents with increasing voltages applied to the gate. From the gate voltage and current values obtained, an S-factor (mV/decade) is calculated.

For the MOS field effect transistor of the fourth embodiment, S-factors of the n-channel and p-channel MOS transistors are obtained as 72 and 70, respectively. Since the S-value for conventional MOS devices is generally approximately 80, the present results indicate that, by the present process of CMOS transistor fabrication, S-factors have been thus found small enough to satisfy the circuitry requirement for both p-channel and n-channel transistors, simultaneously.

Referring to FIGS. 9a through 11, a fifth embodiment of the present invention is described. In the following description, fabrication steps different from those previously described are primarily detailed with the same reference numerals as in the previous embodiments representing the same or like elements.

FIGS. 9a through 9c, FIGS. 10a through 10d, and FIG. 11, respectively, are views illustrating initial, middle and final steps during the fabrication process of a MOS field effect transistor according to an embodiment of the present invention.

At this point, it is worth to note that, as will be described hereinbelow, the fabrication process of the present embodiment is characterized by the steps of forming a well region 15 and an opposite-polarity region 156 having different and arbitrarily adjusted impurity concentrations, thus eliminating a channel doping process for both n-channel and p-channel MOS transistors. By contrast, in the previous fourth embodiment, the channel doping is carried out by implanting ions right after the formation of the opposite-polarity region 156.

The fabrication steps previously illustrated in FIGS. 6c through 8c correspond to the steps presently illustrated in FIGS. 9a through 10b and 11.

Prior to the formation of an opposite-polarity region, the aforementioned steps are carried out in a manner similar to those described above with respect to the fourth embodiment, such as forming an n well region 15, a p well region 15, and subsequently, a field oxide 17.

Figure 9A:
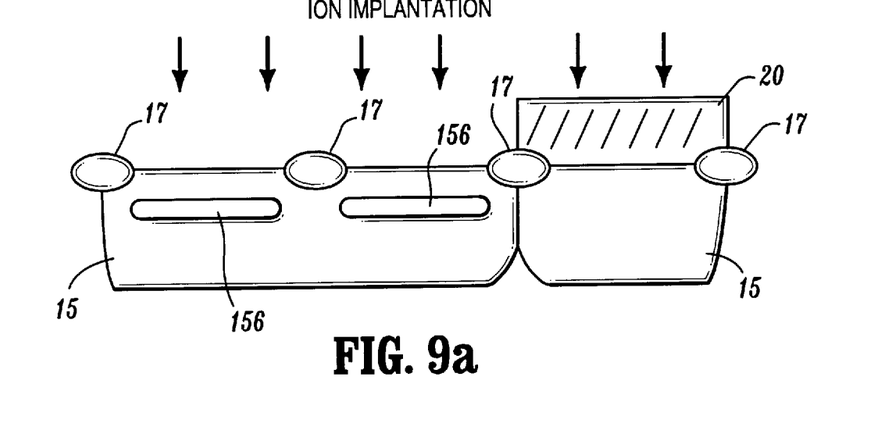
FIGS. 9a through 9c are cross-sectional views of the structure of FIG. 5 during initial steps in the fabrication process in accordance with a fifth embodiment of the present invention.

Following the above steps, opposite-polarity (i.e., p-type) regions 156 which are surrounded by an n well 15 is formed by implanting boron ions of an energy of approximately 50 keV and a dose of approximately $5 \times 10^{12} \text{cm}^{-2}$, as shown in FIG. 9a. To form a channel region of a p-channel MOS field effect transistor, another implantation is carried out with phosphorus ions of an energy of approximately 10 keV and a dose of approximately $1 \times 10^{12} \text{cm}^{-2}$.

Figure 9B:
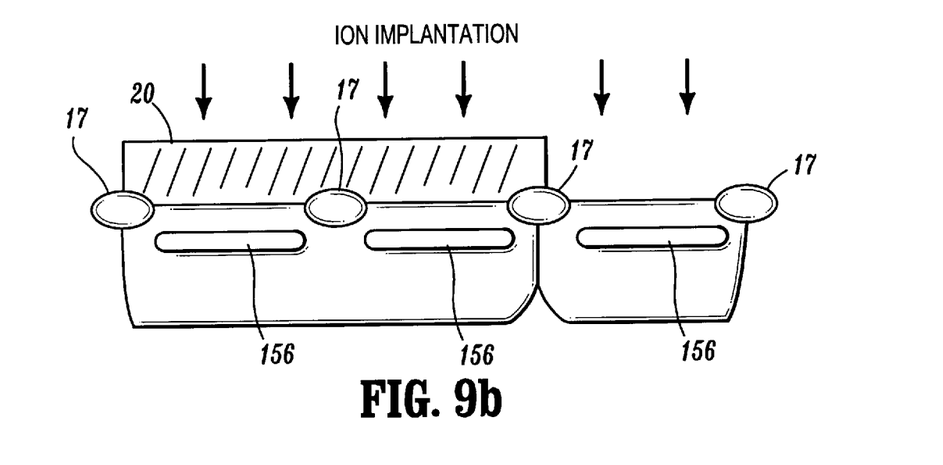

Referring to FIG. 9b, in the p well region 15, an opposite-polarity region 156 is formed by implanting phosphorus ions of an energy of approximately 100 keV and a dose of approximately $1 \times 10^{13} \text{cm}^{-2}$, and another implantation is subsequently carried out to form a channel region of an n-channel MOS field effect transistor with boron ions of an energy of approximately 10 keV and a dose of approximately 9 $10^{12} \text{cm}^{-2}$.

Figure 9C:
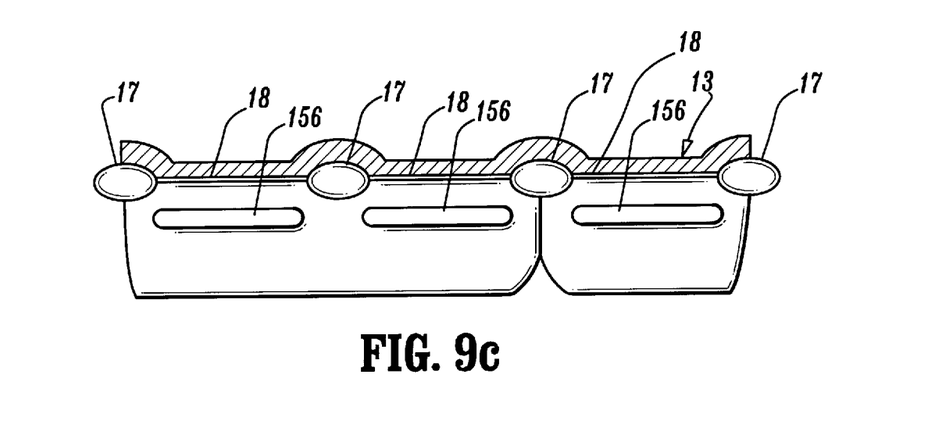

Subsequently, a gate oxide layer 18 of silicon oxide is disposed by thermal oxidation to a thickness of 8 nanometers, and a non-doped polysilicon layer 13 is formed to a thickness of 200 nanometers, as shown in FIG. 9c.

Figure 10A:
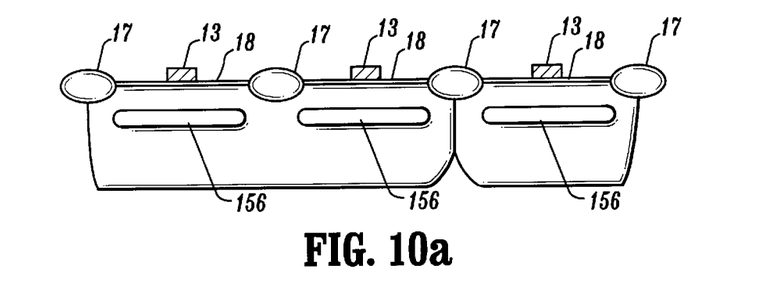
FIGS. 10a through 10d are cross-sectional views of the structure of FIG. 5 during final steps in the fabrication process in accordance with the fifth embodiment of the present invention.

In FIG. 10a, there are formed gate electrodes by implanting portions of the non-doped polysilicon layer 13, at which gates of n-channel MOS transistors are to be formed, with arsenic ions of an energy of approximately 50 keV and a dose of approximately $5 \times 10^{15} \text{cm}^{-2}$. Also, implantation into locations on the non-doped polysilicon layer 13, at which gates of p-channel MOS transistors are to be formed, is carried out with boron ions of an energy of approximately 10 keV and a dose of approximately $5 \times 10^{15} \text{cm}^{-2}$. Thereafter, a photo-etching process is carried out to define the pattern of the gate electrodes, thereby forming the gate electrodes of the p-channel and n-channel MOS transistors.

Figure 10B:
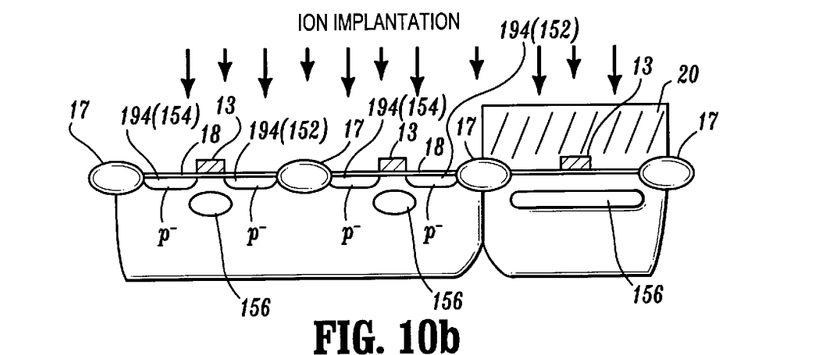

Referring to FIG. 10b, to form p⁻ regions 194 in which source 152 and drain 154 regions of the p-channel MOS transistor are to be formed, boron ions of an energy of approximately 10 keV and a dose of approximately $2 \times 10^{13} \text{cm}^{-2}$ are implanted. Subsequently, phosphorus ions of an energy of approximately 100 keV and a dose of approximately $1 \times 10^{13} \text{cm}^{-2}$ are implanted, thereby also forming an opposite-polarity region 156 in the p-channel MOS transistor.

Figure 10C:
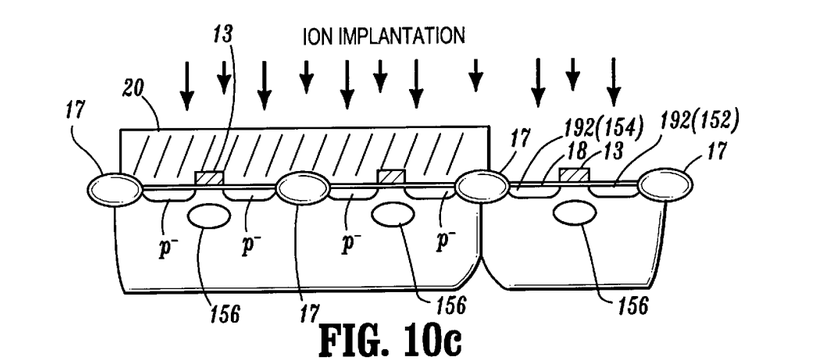

Furthermore, as shown in FIG. 10c, to form n⁻ regions 192 in which source 152 and drain 154 regions of the n-channel MOS transistor are to be formed, arsenic ions of an energy of approximately 10 keV and a dose of approximately $2 \times 10^{13} \text{cm}^{-2}$ are implanted. Subsequently, boron ions of an energy of approximately 40 keV and a dose of approximately $1 \times 10^{13} \text{cm}^{-2}$ are implanted, thereby also forming an opposite-polarity region 156 in the n-channel MOS transistor.

Figure 10D:
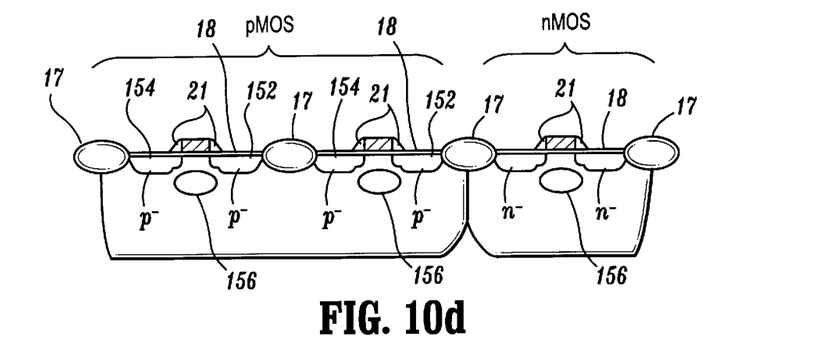

Subsequently, a silicon oxide layer is disposed by high temperature CVD to a thickness of 200 nanometers, and etched back by, for example, a dry etching method, to form a pair of side walls 21 on opposing walls of the gate electrode 13 of the MOS transistor, as shown FIG. 10d.

Thereafter, using the side walls 21 and gate electrodes 13 as a mask, portions at which source 152 and drain 154 regions, having a high impurity concentration are to be formed, are implanted with (1) $BF_2$ ions of approximately 30 keV and a dose of approximately $5 \times 10^{15} \text{cm}^{-2}$ for p-channel MOS transistors, and (2) arsenic ions of approximately 30 keV and a dose of approximately $5 \times 10^{15} \text{cm}^{-2}$ for n-channel MOS transistors.

To obtain the MOS transistor characteristics, the devices fabricated as above are subjected to characteristic measurements. The measurements are carried out by (1) applying 1.5 volt to drain, (2) adjusting the potential of the gate and the substrate at 0 volt, and (3) measuring both values of the substrate and drain currents with increasing voltages applied to the gate. From the gate voltage and current values obtained, an S-factor (mV/decade) is calculated.

For the MOS field effect transistor of this fifth embodiment, S-factors (mV/decade) of the n-channel and p-channel MOS transistors are obtained as 72 and 70, respectively. Since the S-value for conventional MOS devices is generally approximately 80, the present results indicate that, by the present process of CMOS transistor fabrication, S-factors have been thus found small enough to satisfy the circuitry requirement for both p-channel and n-channel transistors, simultaneously.

It is worth mentioning that a plurality of the opposite-polarity regions in these embodiments are fabricated to be isolated not only in the direction along the line A–A' in FIG. 5 (or FIG. 7c, for example), but also along the line B–B' in FIG. 5 (or FIG. 7b, for example) which is orthogonal to the line A–A', thereby ensuring the isolation between neighboring opposite-polarity regions.

Figure 11:
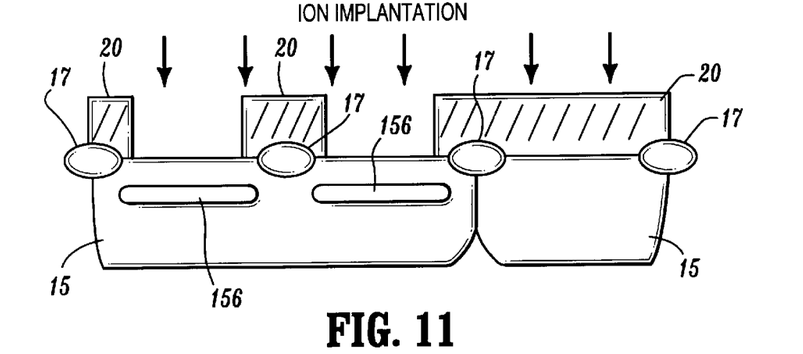
FIG. 11 is a cross-sectional view of the structure of FIG. 5 during the initial step in the fabrication process in accordance with the fifth embodiment of the present invention, using a resist mask having a narrower opening.

To further improve the isolation between opposite-polarity regions, an ion implantation may be carried out with a mask, the edge of which is made so as to cover a larger area over the field oxide and have a narrower opening, as shown in FIG. 11, in place of the mask used in the step in FIG. 9a or 9b, in which the field oxide 17 itself is used as the mask, thereby exposing the whole area of the channel region and thus resulting in wider opposite-polarity regions. This process with the mask may facilitate also a reduction in the electrical interference between the adjacent MOS devices and/or leakage currents between the adjacent well regions 15.

In the previous embodiments, the formation of each of a shallow p and n well is carried out following the formation step of the low impurity concentration region (i.e., n⁻ region 192 or p⁻ region 194, FIG. 10) at which source 152 or drain 154 regions are to be formed. However, this step for the shallow well formation may also be carried out right before or after the step of forming high impurity concentration portions in the source 152 and the drain 154 regions using side walls 21 and gate electrodes 13 as a mask.

As will be apparent from the above description including the examples, the semiconductor device of the present invention is fabricated, as aforementioned, including an opposite-polarity region formed in a predetermined location under a gate channel region of the MOS field effect transistor, having a conductivity type opposite to that of a surrounding well region. By controlling the gate voltage, the opposite-polarity region induces a surrounding second depleted layer region, and this couples with a first depleted region, and is controllable, in turn, by the gate voltage.

This structure of the semiconductor device has achieved (1) drain currents more responsive to gate voltage, (2) reduced leakage currents at zero voltage and lowered standby currents, and (3) lowered threshold voltage $V_{th}$ to turn ON or OFF the device. These improvements are quite advantageous for implementing large integrated circuit (LSI) devices operable at lower voltages.

In addition, it should be added that these improvements can be achieved in the present invention without further increase in the number of photolithography processes and/or the number of photoresist masks, and with a high yield and reproducibility.

Additional modifications and variations of the present invention are possible in light of the above teachings. It is therefore to be understood that within the scope of the appended claims, the invention may be practiced otherwise than as specifically described herein.

What is claimed is:

1. A semiconductor device, comprising:

a semiconductor substrate of a first conductive type;

a uniformly doped well region of a second conductive type formed on said semiconductor substrate;

a MOS field effect transistor formed in said uniformly doped well region and having a gate electrode formed on a gate insulation film and a gate channel region; and an opposite-polarity region formed under said gate channel region of said MOS field effect transistor, said opposite-polarity region being surrounded by said uniformly doped well region, and said opposite-polarity region having a conductive type opposite to that of said uniformly doped well region.

2. The semiconductor device according to claim 1, wherein said opposite-polarity region is formed in said gate channel region of said MOS field effect transistor so that, by applying a gate voltage, a second depleted region is induced concurrent with, and surrounding said opposite-polarity region and can be coupled with a first depleted region which is controllable by said applied gate voltage.

3. The semiconductor device according to claim 1, wherein said opposite-polarity region is formed under said gate channel region of said MOS field effect transistor, and at a distance of 0.5 micron at most between an uppermost portion of said opposite-polarity region and a lowermost portion of said gate electrode.

4. A method of operating a semiconductor device comprising steps of:

providing a semiconductor device including a semiconductor substrate of a first conductive type;

a uniformly doped well region of a second conductive type formed on said semiconductor substrate;

a MOS field effect transistor, formed in said uniformly doped well region and having a gate electrode formed on a gate insulation film and a gate channel region;

an opposite-polarity region formed under said gate channel region of said MOS field effect transistor, said opposite-polarity region being surrounded by said uniformly doped well region, and said opposite-polarity region having a conductive property opposite to that of said uniformly doped well region; and controlling a gate voltage by applying a gate voltage so that a second depleted layer region is induced concurrently with said opposite-polarity region and can be coupled with a first depleted region which is formed under said gate channel region and is controllable by said applied gate voltage.

5. The method according to claim 4, wherein said opposite-polarity region is formed in said channel region of said MOS field effect transistor, and at a distance of 0.5 micron at most between an uppermost portion of said opposite-polarity region and a lowermost portion of said gate electrode.

* * * * *